United States Patent
Kimura

(10) Patent No.: US 7,397,297 B2
(45) Date of Patent: Jul. 8, 2008

(54) LEVEL SHIFTER CIRCUIT

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 52 days.

(21) Appl. No.: 11/670,398

(22) Filed: Feb. 1, 2007

(65) Prior Publication Data

US 2007/0176668 A1    Aug. 2, 2007

(30) Foreign Application Priority Data

Feb. 2, 2006    (JP) .............................. 2006-025899

(51) Int. Cl.
*H03L 5/00* (2006.01)
(52) U.S. Cl. ........................ 327/333; 326/81
(58) Field of Classification Search ................. 327/333; 326/81
See application file for complete search history.

(56) References Cited

U.S. PATENT DOCUMENTS 6,583,647 B2 *   6/2003   Kim et al. ..................... 326/81
6,919,743 B2 *   7/2005   Tobita ......................... 327/108
2004/0160258 A1 *   8/2004   Tobita ......................... 327/333
2005/0073349 A1 *   4/2005   Li ............................... 327/333

FOREIGN PATENT DOCUMENTS

JP    10-135818 A    5/1998
JP    2001-293865 A    10/2001
JP    2002-253319 A    9/2002

\* cited by examiner

*Primary Examiner*—Kenneth B. Wells
*Assistant Examiner*—Ryan C Jager
(74) *Attorney, Agent, or Firm*—Charles Bergere

(57) ABSTRACT

A level shifter circuit, which includes a Schmitt trigger function, shifts voltage of a high level signal into a low voltage and shifts a signal at an intermediate value of an input voltage. The level shifter circuit includes an input terminal connected to low and high voltage circuits. The low voltage circuit outputs a low drive voltage or ground voltage. The high voltage circuit outputs a high drive voltage or a high reference voltage, which is supplied to an RS latch circuit via a potential adjustment circuit at a level equal to an output potential at the low voltage circuit. The RS latch circuit uses the output of the potential adjustment circuit when the input voltage shifts to a high level and uses the output of the low voltage circuit when the input voltage shifts to a low level.

5 Claims, 4 Drawing Sheets

LEVEL SHIFTER CIRCUIT

BACKGROUND OF THE INVENTION

The present invention relates to a level shifter circuit for shifting voltage of an input signal from a high voltage to a low voltage.

There is a trend in reducing power consumption in electronic circuits. For example, power consumption may be reduced by lowering the voltage of a high level signal. More specifically, a high level signal voltage that was five volts may now be a lower voltage (e.g., three volts). However, in an electronic circuitry used to drive a device, it is difficult for all circuits to be low voltage circuits. Thus, in an electronic circuitry, circuits using high voltage power supplies may be mixed together with circuits using low voltage power supplies. In such a circuit, when providing a signal for a high voltage circuit to a low voltage circuit, a level shifter circuit is used to shift the voltage of the signal (refer to Japanese Laid-Open Patent Publication No. 10-135818, FIG. 6 and Japanese Laid-Open Patent Publication No. 2003-101403, FIG. 2).

The prior art level shifter circuit described in Japanese Laid-Open Patent Publication No. 10-135818 and Japanese Laid-Open Patent Publication No. 2003-101403 will now be described with reference to FIGS. 3 and 4. FIG. 3 shows a level shifter circuit 100. Input voltage VIN is applied to an input terminal, which is connected to the drain terminal of an n-channel MOS transistor 101. Low power supply voltage VDD2 is applied to the gate terminal of the MOS transistor 101.

Three MOS transistors 105, 106, and 107 are connected in series between a supply line for the low power supply voltage VDD2 and a supply line for high power supply voltage VSS. The MOS transistors 105 and 107 are n-channel MOS transistors and the MOS transistor 106 is a p-channel MOS transistor. The drain and gate terminals of the MOS transistor 105 are connected to the supply line for the low power supply voltage VDD2. Thus, the MOS transistor 105 is normally ON and the voltage at the source terminal of the MOS transistor 105 is equal to a low drive voltage VDD, which is obtained by subtracting a threshold voltage of the MOS transistor 105 from the low power supply voltage VDD2.

The source terminal of the MOS transistor 101 that functions as a connection node A0 is connected to the gate terminals of the MOS transistors 106 and 107. Further, a connection node of the MOS transistors 106 and 107 function as an output terminal of the level shifter circuit 100. Thus, the MOS transistors 106 and 107 are switched in accordance with the voltage applied to the connection node A0 of the MOS transistor 101. Further, the power supply voltage VSS or the low drive voltage VDD is output from the output terminal of the level shifter circuit 100.

As shown in FIG. 3, the input terminal of the level shifter circuit 100 is connected to an inverter 110. The inverter 110 is connected to a supply line for a high drive voltage HVDD or a supply line for the power supply voltage VSS and uses one of these voltages as an output voltage. The gate terminal of the MOS transistor 101 is connected to the supply line for the low power supply voltage VDD2. Thus, even if the input voltage VIN increases, the voltage at the source terminal of the MOS transistor 101 does not become greater than or equal to the voltage obtained by adding a threshold voltage to the low power supply voltage VDD2. As a result, a large voltage is not applied to the gate terminals of the MOS transistors 106 and 107, and transistors of a low breakdown voltage may be used.

Output voltage VOUT of such a circuit varies in accordance with the input voltage VIN. For example, in accordance with changes in the input voltage VIN as shown in FIG. 4A, the voltage at the connection A0 is as shown in FIG. 4B. Further, the output voltage VOUT of the level shifter circuit 100 varies at intermediate values between the power supply voltage VSS and the low drive voltage VDD as shown in FIG. 4C. The intermediate values are lower than intermediate values between the power supply voltage VSS and the high drive voltage HVDD. Thus, when the input has a low level, the immunity to noise is low and the output voltage may become unstable.

A Schmitt trigger circuit is a circuit that is immune to noise (refer to, for example, Japanese Laid-Open Patent Publication No. 2004-096319, FIG. 5). The Schmitt trigger circuit described in Japanese Laid-Open Patent Publication No. 2004-096319 will now be described with reference to FIG. 5. A Schmitt trigger circuit 200 includes p-channel MOS transistors P1, P2, P3, and P4 and n-channel MOS transistors N1, N2, N3, and N4. The MOS transistors P1, P3, N3, and N1 are connected in series between a supply line for a low drive voltage VDD and a line for ground voltage GND. Input voltage VIN is applied to the gate terminal of each of the MOS transistors P1, P3, N3, and N1.

The source terminal of the MOS transistor P2 is connected to the supply line for the low drive voltage VDD, and the source terminal of the MOS transistor N2 is connected to the line for the ground voltage GND. The drain terminals of the MOS transistors P2 and N2 are connected to each other. Voltage at a connection node TY of the MOS transistors P2 and N2 becomes the output voltage VOUT. The gate terminals of the MOS transistors P2 and N2 are connected to each other at a connection node TX.

The MOS transistor P4 includes a source terminal connected to a connection node of the MOS transistors P1 and P3 and a drain terminal connected to a line for the ground voltage GND. The MOS transistor N4 includes a source terminal connected to a connection node of the MOS transistors N1 and N3 and a drain terminal connected to a supply line for the low drive voltage VDD. The gate terminals of the MOS transistors P4 and N4 are connected to the connection node TX.

When a high level signal is input to the Schmitt trigger circuit as the input voltage VIN, voltage Va at the connection node TX is shifted to a low level, and the output voltage VOUT is shifted to a high level. In this state, the MOS transistors P1, P3, N2, and N4 are inactivated, and the MOS transistors N1, N3, P2, and P4 are activated.

When the input signal shifts from a high level to a low level and the input voltage VIN exceeds a pinch-off voltage, current starts to flow through the MOS transistor P1. In this state, the drain voltage of the MOS transistor P1 is decreased due to the ON resistance balance of the MOS transistors P1 and P4. Thus, the MOS transistor P3 does not function unless the voltage further decreases. That is, the MOS transistor P3 functions when the input signal further decreases. This shifts the voltage Va to the low drive voltage VDD. Accordingly, the MOS transistor P2 is inactivated, the MOS transistor N2 is activated, and the output voltage VOUT is output at a low level. Thus, when the current supplied by the MOS transistors P1, P3, and P4 and the current supplied by the MOS transistors N1 and N3 are inverted, the output signal shifts from a high level to a low level.

When the input signal shifts from a low level to a high level, due to the MOS transistor N2, the MOS transistor N3 does not function unless the input voltage VIN becomes further higher. Thus, unlike when there is no MOS transistor N4, the voltage Va at the connection node does not change unless the input voltage VIN is higher. As a result, in the Schmitt trigger circuit 200 shown in FIG. 5, a hysteresis appears as shown in FIG. 6 and realizes the Schmitt trigger function.

The level shifter circuit 100 shown in FIG. 3 does not have a hysteresis and thus does not function as a Schmitt trigger. To shift a high level signal from a high voltage to a low voltage while being immune to noise, the Schmitt trigger circuit 200 shown in FIG. 5 may be included in the level shifter circuit 100 of FIG. 3. A level shifter circuit 300 formed in such a manner is shown in FIG. 7. In the level shifter circuit 300 of FIG. 7, the same reference numerals are given to those components that are the same as the corresponding components of the level shifter circuit 100 shown in FIG. 3 and the Schmitt trigger circuit 200 shown in FIG. 2. Such components will not be described in detail. In the level shifter circuit 300, input voltage VIN is applied to the drain terminal of the n-channel MOS transistor 101, and the input terminal of the Schmitt trigger circuit 200 is connected to the drain terminal of the n-channel MOS transistor 101. Further, the low drive voltage VDD is applied to the source terminal of the MOS transistor 105, and the voltage at the connection node TY of the Schmitt trigger circuit 200 becomes the output voltage VOUT.

The VIN-VOUT curve of the level shifter circuit 300 is shown in FIG. 8. The level shifter circuit 300 includes the Schmitt trigger function, which has hysteresis. However, even if the input voltage VIN is applied from the power supply voltage VSS (here, the ground voltage GND) to the high drive voltage HVDD, the output voltage VOUT of the level shifter circuit 300 shifts between zero volts and the low drive voltage VDD. Thus, the output voltage VOUT still changes at a voltage that is lower than the intermediate values that the input voltage VIN can take.

SUMMARY OF THE INVENTION

Accordingly, it is an object of the present invention to provide a level shifter circuit that has a Schmitt trigger function, shifts a high level signal voltage to a low voltage, and switches a signal at an intermediate value of an input voltage.

One aspect of the present invention is a level shifter circuit including a low voltage circuit for performing a switching operation in accordance with a first switching voltage, which changes in relation with an input voltage applied to an input terminal, to output voltage between a low drive voltage and a low reference voltage, which is lower than the low drive voltage. A high voltage circuit performs a switching operation based on a second switching voltage, which is higher than the first switching voltage and changes in relation with the input voltage, to output voltage between a high drive voltage and a high reference voltage, which is lower than the high drive voltage. A potential adjustment circuit shifts an output of the high voltage circuit from the high drive voltage to the low drive voltage and from the high reference voltage to the low reference voltage. An output selection circuit outputs a signal in accordance with an output of the potential adjustment circuit when a signal at the input terminal shifts from a low level to a high level, and outputs a signal in accordance with an output of the low voltage circuit when the signal at the input terminal shifts from a high level to a low level.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
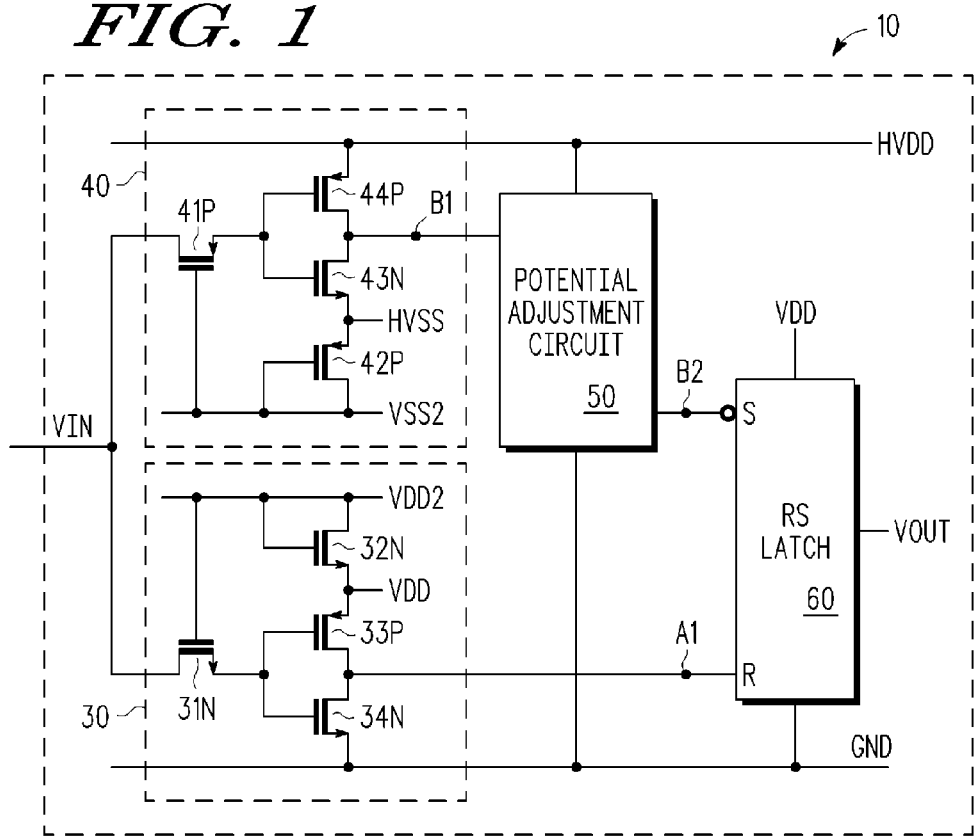
FIG. 1 is a circuit diagram of a level shifter circuit including a Schmitt trigger function according to the present invention.

A preferred embodiment of the present invention will now be described with reference to FIGS. 1 and 2. As shown in FIG. 1, a level shifter circuit 10 includes an input terminal, into which an input voltage VIN is input, and an output terminal, from which an output voltage VOUT is output. The level shifter circuit 10 uses a high drive voltage HVDD, a high reference voltage HVSS, and a high power supply voltage VSS2 functioning as a second high reference voltage. Further, the level shifter circuit 10 uses a low drive voltage VDD, a ground voltage GND functioning as a low reference voltage, and a low power supply voltage VDD2 functioning as a second low drive voltage. In the present embodiment, the difference between the high drive voltage HVDD and the high reference voltage HVSS is equal to the difference between the ground voltage GND and the low drive voltage VDD. Further, in the present embodiment, the high drive voltage HVDD is five volts, and the low drive voltage VDD is three volts. The level shifter circuit 10 uses MOS transistors having the same threshold voltage Vth.

The level shifter circuit 10 includes a low voltage circuit 30 and high voltage circuit 40 connected to the input terminal, a potential adjustment circuit 50 for adjusting potential, and an RS latch circuit 60 functioning as an output selection circuit. The low voltage circuit 30 and high voltage circuit 40 have the same wiring structure but uses MOS transistors of different conductive types at corresponding positions. The low voltage circuit 30 and high voltage circuit 40 are connected in parallel to the input terminal of the level shifter circuit 10.

In the low voltage circuit 30, the drain terminal of a transistor 31N, which functions as a first voltage adjustment means, is connected to the input terminal to which the input voltage VIN is applied. The gate terminal of the transistor 31N, which is an n-channel MOS transistor, is connected to a supply line for the low power supply voltage VDD2. Thus, in a maximum state, the voltage at the gate terminal of the transistor 31N (first switching voltage) is equal to the voltage obtained subtracting the threshold voltage Vth of the transistor 31N from the low power supply voltage VDD2, that is, the low drive voltage VDD. Accordingly, the voltage applied to the source terminal of the transistor 31N is between the ground voltage GND and the low drive voltage VDD.

Transistors 32N, 33P, and 34N are connected between the supply line for the low power supply voltage VDD2 and a line for the ground voltage GND. The transistors 32N and 34N are n-channel MOS transistors. The transistor 33P is a p-channel MOS transistor. The gate terminal and drain terminal of the transistor 32N, which functions as a third voltage adjustment means, is connected to the supply line for the low power supply voltage VDD2. Thus, the transistor 32N is normally ON and the voltage at its source terminal is equal to the low drive voltage VDD, that is, the voltage obtained by subtracting the threshold voltage Vth of the transistor 32N from the low power supply voltage VDD2. Further, the source terminal of the transistor 32N is connected to the source terminal of the transistor 33P. Thus, the voltage at a connection node of the transistor 32N is equal to the low drive voltage VDD.

The transistors 33P and 34N form a complementary transistor circuit. The gate terminals of the transistors 33P and 34N are connected to the source terminal of the transistor 31N. Changes in the voltage applied to the gate terminals activate and inactivate the transistors 33P and 34N. A connection node A1 connects the drain terminal of the transistor 33P and the drain terminal of the transistor 34N. Accordingly, the low drive voltage VDD or the ground voltage GND is output as the voltage at the connection node A1 by the activation and inactivation of the transistors 33P and 34N.

In the high voltage circuit 40, the drain terminal of a transistor 41P, which functions as a second voltage adjustment means, is connected to the input terminal to which the input voltage VIN is applied. The gate terminal of the transistor 41P, which is a p-channel MOS transistor, is connected to a supply line for the high power supply voltage VSS2. Thus, in a minimum state, the voltage at the gate terminal of the transistor 41P (second switching voltage) is equal to the voltage obtained by adding the threshold voltage Vth of the transistor 41P to the high power supply voltage VSS2, that is, the high reference voltage HVSS. Accordingly, the voltage applied to the source terminal of the transistor 41P is between the high reference voltage HVSS and the high drive voltage HVDD.

Transistors 42P, 43N, and 44P are connected between the supply line for the high power supply voltage VSS2 and a supply line for the high drive voltage HVDD. The transistors 42P and 44P are p-channel MOS transistors. The transistor 43N is an n-channel MOS transistor. The gate terminal and drain terminal of the transistor 42P, which functions as a fourth voltage adjustment means, is connected to the supply line for the high power supply voltage VSS2. Thus, the voltage at a connection node between the transistors 42P and 43N is equal to the voltage obtained by adding the threshold voltage Vth of the transistor 42P to the high power supply voltage VSS2, that is, the high reference voltage HVSS. Further, the source terminal of the transistor 42P is connected to the source terminal of the transistor 43N. Thus, the voltage at a connection node of the transistor 42P is equal to the high reference voltage HVSS.

The transistors 43N and 44P form a complementary transistor circuit. The gate terminals of the transistors 43N and 44P are connected to the source terminal of the transistor 41P. Changes in the voltage applied to the gate terminals activate and inactivate the transistors 43N and 44P. A connection node B1 connects the drain terminal of the transistor 43N and the drain terminal of the transistor 44P. Accordingly, the high drive voltage HVDD or the high reference voltage HVSS is output as the voltage at the connection node B1 by the activation and inactivation of the transistors 43N and 44P.

The connection node B1 of the drain terminal of the transistor 43N and the drain terminal of the transistor 44P is connected to the potential adjustment circuit 50. The potential adjustment circuit 50 includes, for example, a resistor, and is connected to the RS latch circuit 60. The potential adjustment circuit 50 lowers the high drive voltage HVDD by a predetermined potential to the low drive voltage VDD and the high reference voltage HVSS by the predetermined potential to the ground voltage GND. More specifically, referring to FIG. 2, the potential adjustment circuit 50 lowers the potential input to the connection node B1 and supplies the RS latch circuit 60 with the lowered potential.

The RS latch circuit 60 is formed by a known circuit including, for example, two NAND circuits. The RS latch circuit 60 has a set input terminal including a connection node B2 connected to the potential adjustment circuit 50. An inverted signal of the output signal of the potential adjustment circuit 50 is input to the set input terminal of the RS latch circuit 60. Further, the RS latch circuit 60 has a reset input terminal including the connection node A1 of the drain terminals of the transistors 33P and 34N in the low voltage circuit 30. The RS latch circuit 60 outputs the output voltage VOUT of the level shifter circuit 10. When the input signal VIN shifts from a low level to a high level, the RS latch circuit 60 outputs the voltage supplied from the potential adjustment circuit 50 as the output voltage VOUT. When the input signal VIN shifts from a high level to a low level, the RS latch circuit 60 outputs the output of the low voltage circuit 30 as the output voltage VOUT.

Figure 2A:
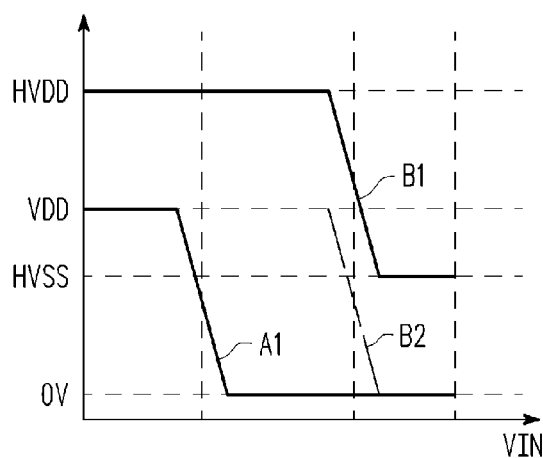
FIG. 2A is a chart showing changes in the voltage at a connection node in relation with the input voltage.
Figure 2B:
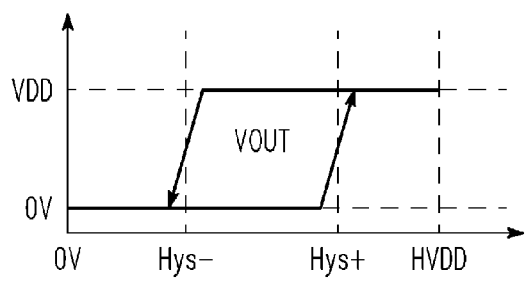
FIG. 2B is a chart showing changes in the voltage at the connection node in relation with the output voltage.
Figure 3:
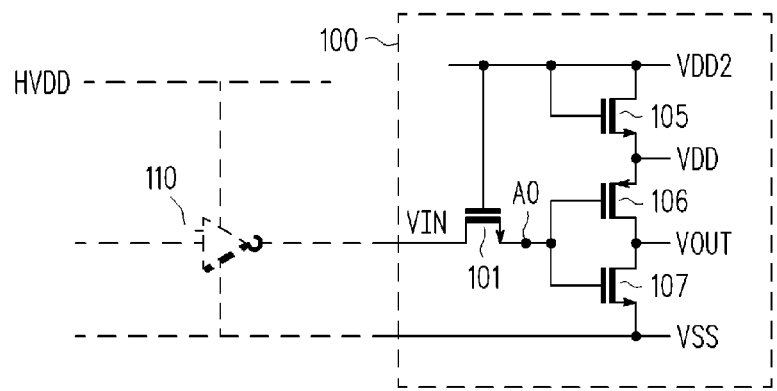
FIG. 3 is a circuit diagram of a level shifter circuit in a first prior art example.
Figure 4A:
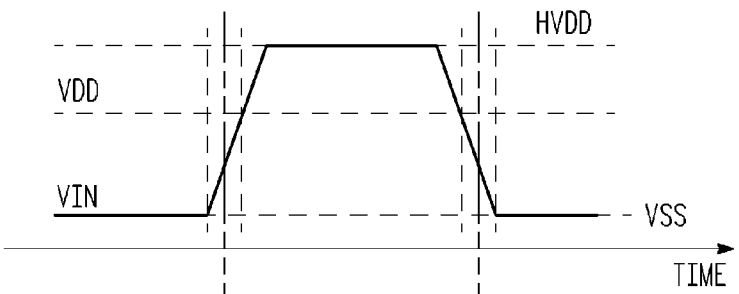
FIG. 4A is a chart showing changes in the input voltage in relation with time in the first prior art example.
Figure 4B:
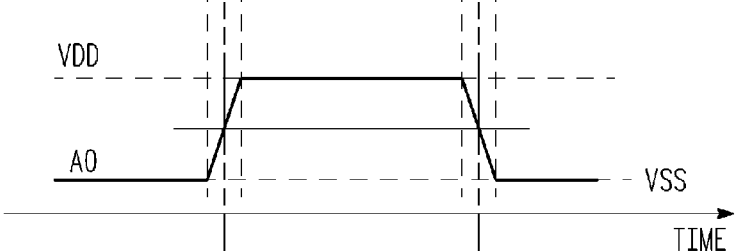
FIG. 4B is a chart showing changes in the voltage at the connection node in relation with time.
Figure 4C:
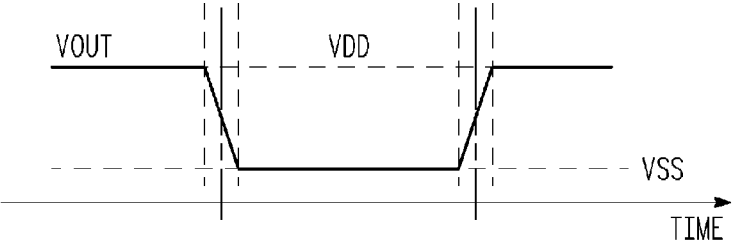
FIG. 4C is a chart showing changes in the output voltage in relation with time.
Figure 5:
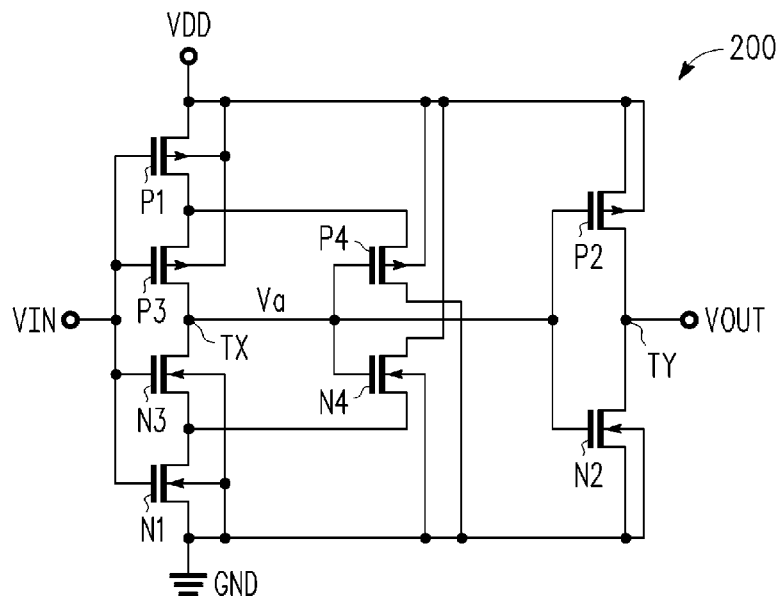
FIG. 5 is a circuit diagram of a Schmitt trigger circuit in a second prior art example.
Figure 6:
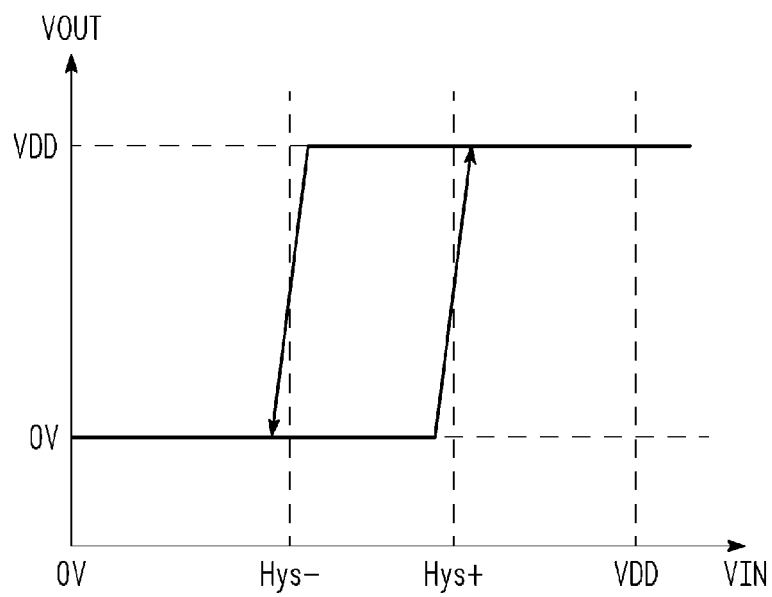
FIG. 6 is a chart showing changes in the output voltage in relation with the input voltage in the second prior art example.
Figure 7:
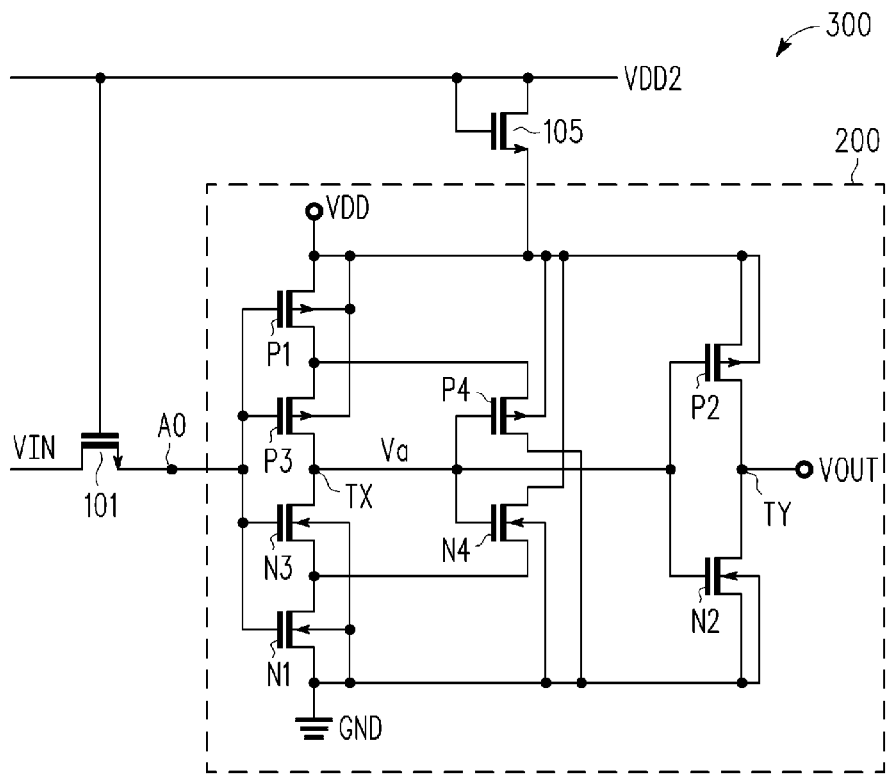
FIG. 7 is a circuit diagram of a level shifter circuit including a Schmitt trigger function that can be derived from the first and second prior art examples.
Figure 8:
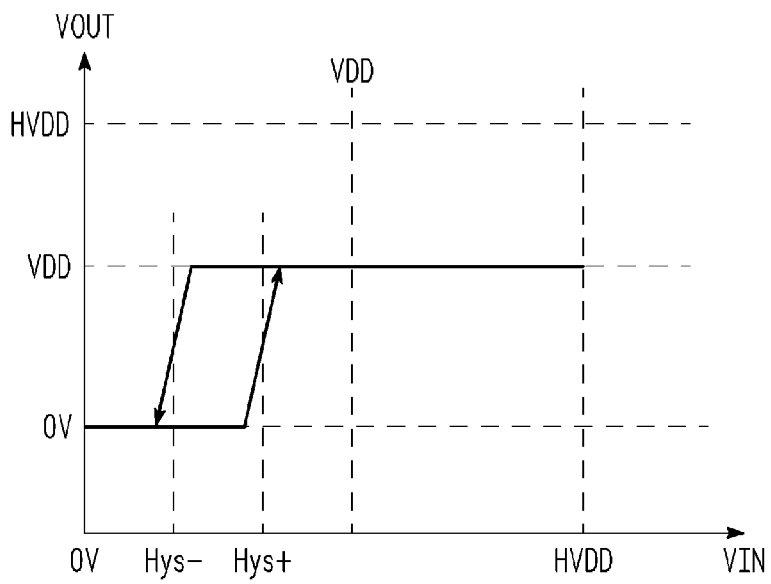
FIG. 8 is a diagram showing changes in the input voltage in relation with the output voltage in the level shifter circuit of FIG. 7.

The operation of the level shifter circuit 10 will now be described with reference to FIGS. 2A and 2B. FIG. 2A shows changes in the voltages at the connection nodes A1, B1, and B2 in relation with the input voltage VIN. FIG. 2B shows changes in the output voltage VOUT in relation with the input voltage VIN.

When the input voltage VIN has a low level, a low level signal is provided to the input terminal, and the input voltage VIN is zero volts. In this case, the source terminal of the transistor 31N in the low voltage circuit 30 has zero volts, which is the same as the input voltage VIN. Thus, voltage is not applied to the gate terminals of the transistors 33P and 34N. Accordingly, the transistor 33P is activated and the transistor 34N is inactivated. Thus, the voltage at the connection node A1, which is equal to the low drive voltage VDD supplied via the transistor 33P, is supplied to the reset input terminal of the RS latch circuit 60.

Further, the source terminal of the transistor 41P in the high voltage circuit 40 is supplied with the input voltage VIN. Thus, the source terminal of the transistor 41P is supplied with the high reference voltage HVSS, which is determined by the high voltage power supply voltage VSS2 applied to the gate terminal of the transistor 41P. The high reference voltage HVSS is applied to the gate terminals of the transistors 43N and 44P. Thus, the transistor 44P is activated, the transistor 43N is inactivated, and the connection node B1 is supplied with the high drive voltage HVDD via the transistor 44P. The high drive voltage HVDD is supplied to the potential adjustment circuit 50. The potential adjustment circuit 50 lowers the high drive voltage HVDD to the low drive voltage VDD, which is output to the connection node B2. Thus, when the input voltage VIN has a low level, as shown in FIG. 2A, the voltage at the connection node B1 becomes equal to the high drive voltage HVDD, and the voltage at the connection node B2 becomes equal to the low drive voltage VDD.

In the RS latch circuit 60, the set input terminal is provided with a low level signal, and the reset input terminal is provided with a high level signal. This resets the RS latch circuit 60 and outputs the low level ground voltage GND as the output voltage VOUT.

When the input voltage VIN shifts from a low level to a high level, the input voltage VIN increases. This increases the voltage at the source terminal of the transistor 31N. Thus, in accordance with the application of this voltage, the voltage applied to the gate terminals of the transistors 33P and 34N increases. When the voltage applied to gate terminals of the transistors 33P and 34N exceeds the threshold voltage Vth, the transistor 33P is inactivated and the transistor 34N is activated. As a result, the voltage at the connection node A1 shifts from the low drive voltage VDD to the ground voltage GND, and a low level signal is input to the reset input terminal of the RS latch circuit 60.

Even if the input voltage VIN exceeds the threshold voltage Vth, the operation of the high voltage circuit 40 does not change. Thus, the output of the low drive voltage VDD at the connection node B1 is maintained. As a result, a low level signal is input to the set input terminal and the reset input terminal of the RS latch circuit 60. This maintains the output of the RS latch circuit 60 at the low level, that is, at zero volts.

As the input voltage VIN continuously increases and the input voltage VIN becomes equal to the high reference voltage HVSS, the flow of current to the transistor 41P is obstructed. This lowers the voltage at the drain terminal of the transistor 41P and decreases the voltage applied to the gate terminals of the transistors 44P and 43N thereby inactivating the transistor 44P and activating the transistor 43N. As a result, the voltage at the connection node B1 shifts from the high drive voltage HVDD to the high reference voltage HVSS, which is supplied to the potential adjustment circuit 50. In this state, a high level signal is input to the set input terminal of the RS latch circuit 60, and the output voltage VOUT of the RS latch circuit 60 shifts from a low level to a high level and becomes equal to the low drive voltage VDD.

When the input voltage VIN has a high level, a high level signal is provided to the input terminal, and the input voltage VIN is equal to the high drive voltage HVDD. In this embodiment, the input voltage VIN is five volts. In this case, the transistor 31N is activated, and the low drive voltage VDD is applied to the gate terminals of the transistors 33P and 34N. Thus, the transistor 33P is inactivated and the transistor 34N is activated, and a low level signal is provided to the reset input terminal of the RS latch circuit 60 via the transistor 34N. In this case, the voltage at the connection node A1 is equal to the ground voltage GND and has zero volts.

Further, the transistor 41P in the high voltage circuit 40 is inactivated. Thus, voltage is not applied to the gate terminals of the transistors 43N and 44P. This inactivates the transistor 44P, activates the transistor 43N, and supplies the potential adjustment circuit 50 with the high reference voltage HVSS via the connection node B1. In the potential adjustment circuit 50, the high reference voltage HVSS is decreased by the low drive voltage VDD to zero volts and output to the connection node B2. In this case, as shown in FIG. 2A, the voltage at the connection node B1 becomes equal to the high reference voltage HVSS and the voltage at the connection node B2 becomes equal to zero volts.

In the RS latch circuit 60, the set input terminal is provided with a high level signal, and the reset input terminal is provided with a low level signal. This sets the RS latch circuit 60 and outputs as the output voltage VOUT the low drive voltage VDD having a high level.

When the input voltage VIN shifts from a high level to a low level, the input voltage VIN decreases. This decreases the voltage at the source terminal of the transistor 41P. Thus, in accordance with the change in voltage, the voltage applied to the gate terminals of the transistors 43N and 44P decreases. When the voltage applied to the gate terminals of the transistors 43N and 44P exceeds the threshold voltage Vth, the transistor 43N is activated and the transistor 44P is inactivated. As a result, the voltage at the connection node B1 shifts from the high reference voltage HVSS to the high drive voltage HVDD, and a low level signal is input to the set input terminal of the RS latch circuit 60.

Even if the input voltage VIN becomes less than a value obtained by subtracting the threshold voltage Vth from the high drive voltage HVDD, the operation of the low voltage circuit 30 does not change. Thus, the output of the ground voltage GND at the connection node A1 is maintained. As a result, a high level signal is input to the set input terminal and reset input terminal of the RS latch circuit 60. This maintains the output of the RS latch circuit 60 at the high level, that is, at the low drive voltage VDD.

As the input voltage VIN continuously decreases and the input voltage VIN becomes less than the low drive voltage VDD, the flow of current to the transistor 31N is obstructed. This lowers the voltage at the drain terminal of the transistor 31N and decreases the voltage applied to the gate terminals of the transistors 34N and 33P thereby inactivating the transistor 34N and activating the transistor 33P. As a result, the voltage at the connection node A1 shifts from the ground voltage GND, which is zero volts, to the low drive voltage VDD, which is supplied to the RS latch circuit 60. In this state, a high level signal is input to the reset input terminal of the RS latch circuit 60, and the output voltage VOUT of the RS latch circuit 60 shifts from a high level to a low level and becomes equal to the ground voltage GND.

The preferred embodiment has the advantages described below.

In the preferred embodiment, the level shifter circuit 10 includes the low voltage circuit 30 and high voltage circuit 40 connected to the input terminal, the potential adjustment circuit 50 for adjusting the potential, and the RS latch circuit 60. The low voltage circuit 30 and high voltage circuit 40 have the same wiring structure but uses MOS transistors of different conductive types at corresponding positions. Thus, the high voltage circuit 40 shifts signals at an intermediate value between the high drive voltage HVDD of the high level signal and the high reference voltage HVSS of the low level signal. However, this voltage is higher than the intermediate value of the input voltage VIN. Thus, the high voltage circuit 40 is switched when the input voltage VIN is high. The potential adjustment circuit 50 lowers the high drive voltage HVDD by a predetermined potential to the low drive voltage VDD and lowers the high reference voltage HVSS by the predetermined potential to the ground voltage GND. Thus, the output voltage of the low voltage circuit 30 and the output voltage of the high voltage circuit 40 are changed by the same potential. When the input voltage VIN shifts from a low level to a high level, the RS latch circuit 60 uses the voltage supplied from the potential adjustment circuit 50 as the output voltage VOUT. Further, when the input voltage VIN shifts from a high level to a low level, the RS latch circuit 60 uses the output of the low voltage circuit 30 as the output voltage VOUT. Thus, the output of the level shifter circuit 10 has hysteresis formed about the value that the input voltage VIN can take. This realizes the Schmitt trigger function with the level shifter circuit 10. Further, the level shifter circuit 10 may output either one of the low drive voltage or the low reference voltage. This enables reduction in the power consumption of the level shifter circuit 10. Accordingly, the level shifter circuit 10 is immune to noise and reduces power consumption.

In the preferred embodiment, the low voltage circuit 30 includes the two transistors 33P and 34N, which switch the output signal, and the transistor 31N, which adjusts the voltage applied to the gate terminals of the transistors 33P and 34N. The high voltage circuit 40 includes the two transistors 43N and 44P, which switch the output signal, and the transistor 41P, which adjusts the voltage applied to the gate terminals of the transistors 43N and 44P. Since the low voltage circuit 30 and the high voltage circuit 40 use MOS transistors of different conductive types but has the same wiring structure, the level shifter circuit 10 is realized with a simple structure.

In the preferred embodiment, the difference between the high drive voltage HVDD and the high reference voltage HVSS is substantially equal to the difference between the low drive voltage VDD and the ground voltage GND. Further, the potential adjustment circuit 50 lowers the output voltage of the high voltage circuit 40 by a predetermined potential to shift the high drive voltage HVDD to the high reference voltage HVSS and the low drive voltage VDD to the ground voltage GND. Since the potential adjustment circuit 50 is only required to lower the voltage output from the high voltage circuit 40 by the predetermined potential, the potential adjustment circuit 50 may have a simple structure.

In the preferred embodiment, the drain terminal of the transistor 31N is connected to the input terminal to which the input voltage VIN is applied. The source terminal of the transistor 31N is connected to the gate terminals of the transistors 33P and 34N. The drain terminal of the transistor 41P is connected to the input terminal to which the input voltage VIN is applied. The source terminal of the transistor 41P is connected to the gate terminals of the transistors 43N and 44P. Thus, the voltage applied to the gate terminals of the transistors 31N and 41P is adjusted to change the voltage applied to the gate terminals of the transistors 33P, 34N, 43N, and 44P. This enables the shifting of a voltage with a simple structure.

In the preferred embodiment, the supply line for the low power supply voltage VDD2 is connected to the source terminal of the transistor 33P via the transistor 32N and to the gate terminal of the transistor 31N. Further, the threshold voltage Vth is substantially the same in the transistors 31N and 32N. Thus, when voltage is applied to the gate terminal of the transistor 33P thereby inactivating the transistor 33P, the voltage at the source terminal of the transistor 31N becomes substantially equal to the voltage at the source terminal of the transistor 33P. This reduces power consumption.

In the preferred embodiment, the output of the low voltage circuit 30 is input to the reset input terminal of the RS latch circuit 60, and the inverted output of the potential adjustment circuit 50 is input to the set input terminal of the RS latch circuit 60. Thus, with a simple structure, the level shifter circuit 10 has hysteresis that is in accordance with the level signal of the low voltage circuit 30 and the high voltage circuit 40.

It should be apparent to those skilled in the art that the present invention may be embodied in many other specific forms without departing from the spirit or scope of the invention. Particularly, it should be understood that the present invention may be embodied in the following forms.

In the preferred embodiment, the RS latch circuit 60 receives a signal generated by inverting the output of the potential adjustment circuit 50 and a signal generated by inverting the output of the low voltage circuit 30. Thus, the RS latch circuit 60 functions as an output selection circuit. The output selection circuit may have a different structure and include a flip-flop circuit or a latch circuit formed by combining logic circuits. For example, the potential adjustment circuit 50 may include an inversion circuit for the connection node B1 of a high voltage circuit, and the output of the potential adjustment circuit 50 may be directly used by the RS latch circuit 60. More specifically, when the signal at the input terminal shifts from a low level to a high level, the output selection circuit is only required to output the output voltage VOUT in accordance with the output from the high voltage circuit 40. When the signal at the input terminal shifts from a high level to a low level, the output selection circuit is only required to output the output voltage VOUT in accordance with the output from the low voltage circuit 30.

In the preferred embodiment, the potential adjustment circuit 50 lowers the output voltage of the high voltage circuit 40 by the difference between the high drive voltage HVDD and the low drive voltage VDD and supplies the RS latch circuit 60 with the voltage shifted in such a manner. The potential adjustment circuit 50 may have any structure as long as it shifts the output of the high voltage circuit 40 to the low drive voltage VDD when the output is the high drive voltage HVDD and shifts the output of the high voltage circuit 40 to the ground voltage GND when the output is the high reference voltage HVSS.

In the preferred embodiment, the signal at the input terminal to which the input voltage VIN is applied is inverted. Further, the output signal of the level shifter circuit 10 is inverted. Instead, the signal at the input terminal to which the input voltage VIN is applied may be the same signal as the output signal of the level shifter circuit 10.

The present examples and embodiments are to be considered as illustrative and not restrictive, and the invention is not to be limited to the details given herein, but may be modified within the scope and equivalence of the appended claims.

What is claimed is:

1. A level shifter circuit comprising:
   a low voltage circuit for performing a switching operation in accordance with a first switching voltage, which changes in relation with an input voltage applied to an input terminal, to output voltage between a low drive voltage and a low reference voltage, which is lower than the low drive voltage;
   a high voltage circuit for performing a switching operation based on a second switching voltage, which is higher than the first switching voltage and changes in relation with the input voltage, to output voltage between a high drive voltage and a high reference voltage, which is lower than the high drive voltage;
   a potential adjustment circuit for shifting an output of the high voltage circuit from the high drive voltage to the low drive voltage and from the high reference voltage to the low reference voltage; and
   an output selection circuit for outputting a signal in accordance with an output of the potential adjustment circuit when a signal at the input terminal shifts from a low level to a high level, and for outputting a signal in accordance with an output of the low voltage circuit when the signal at the input terminal shifts from a high level to a low level.

2. The level shifter circuit according to claim 1, wherein:

the high reference voltage is such that the difference between the low drive voltage and the low reference voltage is substantially equal to the difference between the high drive voltage and the high reference voltage; and the potential adjustment circuit lowers the voltage output from the high voltage circuit by a predetermined potential to shift the high drive voltage to the low drive voltage and the high reference voltage to the low reference voltage.

3. The level shifter circuit according to claim 1, wherein:

the low voltage circuit includes:
- a first voltage adjustment means for adjusting the first switching voltage in relation with the input voltage; and
- a complementary transistor circuit for performing a switching operation between the low drive voltage and the low reference voltage using an output of the first voltage adjustment means; and the high voltage circuit includes:
- a second voltage adjustment means for adjusting the second switching voltage in relation with the input voltage; and
- a complementary transistor circuit for performing a switching operation between the high drive voltage and the high reference voltage using an output of the second voltage adjustment means.

4. The level shifter circuit according to claim 3, wherein:

a voltage between the low reference voltage and the high drive voltage is used as the input voltage;

the first voltage adjustment means includes an n channel MOS transistor having a gate terminal supplied with a second low drive voltage, which is higher than the low drive voltage by a threshold voltage;

the second voltage adjustment means includes a p-channel MOS transistor having a gate terminal supplied with a second high reference voltage, which is lower than the high reference voltage by a threshold voltage;

the complementary transistor circuit of the low voltage circuit is supplied with the second low drive voltage via a third voltage adjustment means including an n-channel lAOS transistor; and the complementary transistor circuit of the high voltage circuit is supplied with the second high reference voltage via a fourth voltage adjustment means including a p-channel lAOS transistor.

5. The level shifter circuit according to claim 1, wherein:

the output selection circuit includes an RS circuit having an input terminal connected to an output terminal of the potential adjustment circuit and an output terminal of the low voltage circuit.

* * * * *